United States Patent [19]
Craig et al.

[11] Patent Number: 5,185,754
[45] Date of Patent: Feb. 9, 1993

[54] SPECTRALLY STABLE LASER DIODE WITH INTERNAL REFLECTOR

[75] Inventors: Richard R. Craig, Palo Alto; David F. Welch, San Jose; Erik P. Zucker, Mountain View; Donald R. Scifres, San Jose; William J. Gignac, Sunnyvale, all of Calif.

[73] Assignee: Spectra Diode Laboratories, Inc., San Jose, Calif.

[21] Appl. No.: 737,194

[22] Filed: Jul. 29, 1991

[51] Int. Cl.$^5$ .................................... H01S 3/19
[52] U.S. Cl. .................................... 372/45; 372/50
[58] Field of Search .................... 372/45, 46, 49, 50

[56] References Cited

U.S. PATENT DOCUMENTS

| | | | |
|---|---|---|---|
| 4,680,769 | 7/1987 | Miller | 372/50 |
| 4,755,015 | 7/1988 | Uno et al. | 350/96.12 |
| 4,788,689 | 11/1988 | Tokuda et al. | 372/45 |
| 4,802,182 | 1/1989 | Thornton et al. | 372/50 |
| 4,815,084 | 3/1989 | Scifres et al. | 372/46 |
| 4,829,535 | 5/1989 | Utaka | 372/50 |
| 4,853,108 | 7/1989 | Utaka et al. | 372/20 |
| 4,899,361 | 2/1990 | Numai | 372/50 |
| 4,960,730 | 10/1990 | Kakimoto | 372/45 |
| 4,977,567 | 12/1990 | Hanke | 372/45 |
| 5,031,188 | 7/1991 | Koch et al. | 372/45 |

Primary Examiner—John D. Lee
Assistant Examiner—Robert E. Wise
Attorney, Agent, or Firm—Schneck & McHugh

[57] ABSTRACT

A laser diode construction having internal reflectors within the laser cavity to provide a stable spectral mode of laser operation. The laser includes a plurality of contiguous semiconductor layers disposed on a substrate to form a semiconductor body with at least one layer forming an active region. Electrically conductive contacts bias the heterostructure to inject current into the active region and produce lightwaves. Feedback means define two or more tandem resonant optical cavities to achieve lasing operation. The feedback means includes at least one internal light reflector within the semiconductor body. In a preferred embodiment, a pair of spaced apart internal reflectors are provided with the region between the pair also being electrically pumped to define an active internal etalon. Other embodiments have multiple periodic reflectors or combine internal reflectors with feedback gratings or passive windows at the end facets of the body.

14 Claims, 3 Drawing Sheets

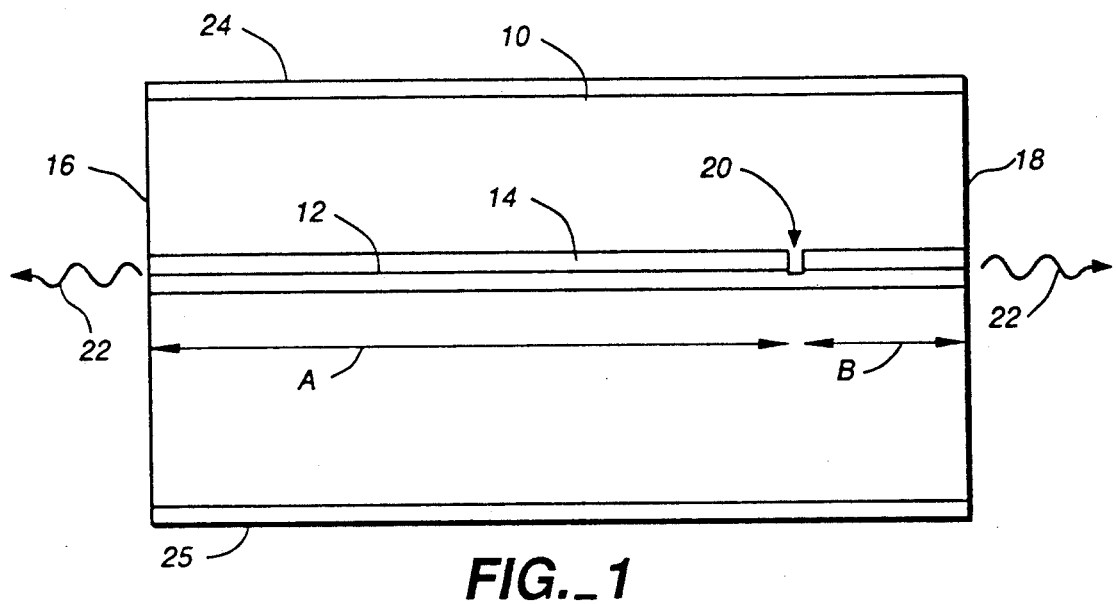
FIG._1
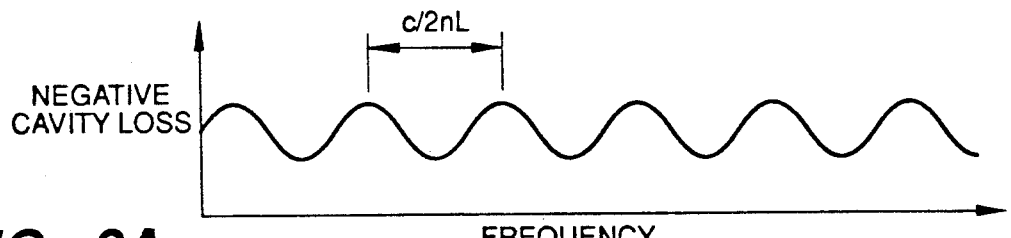
FIG._2A
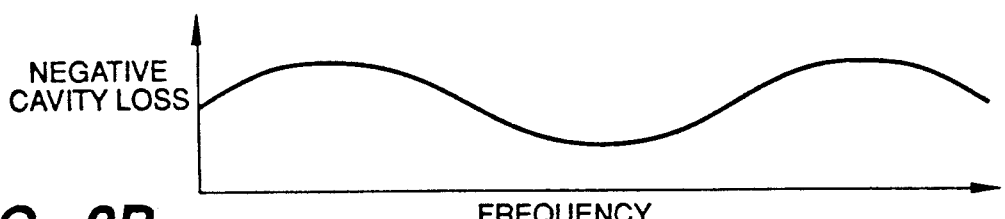
FIG._2B
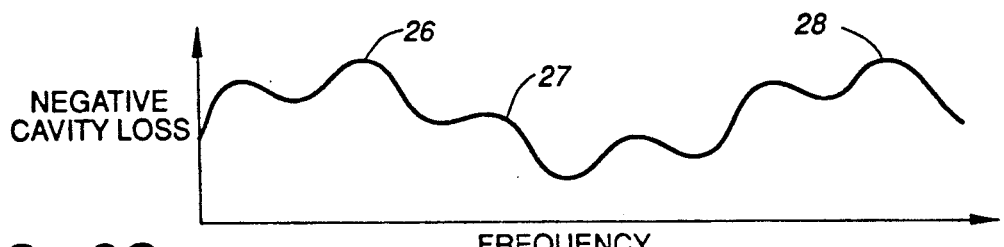
FIG._2C

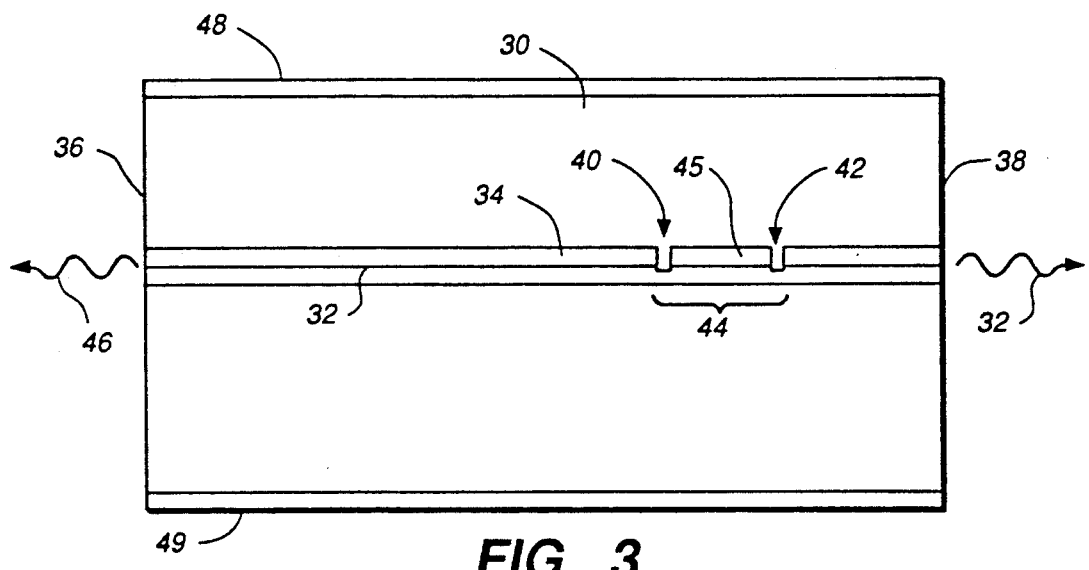
FIG._3
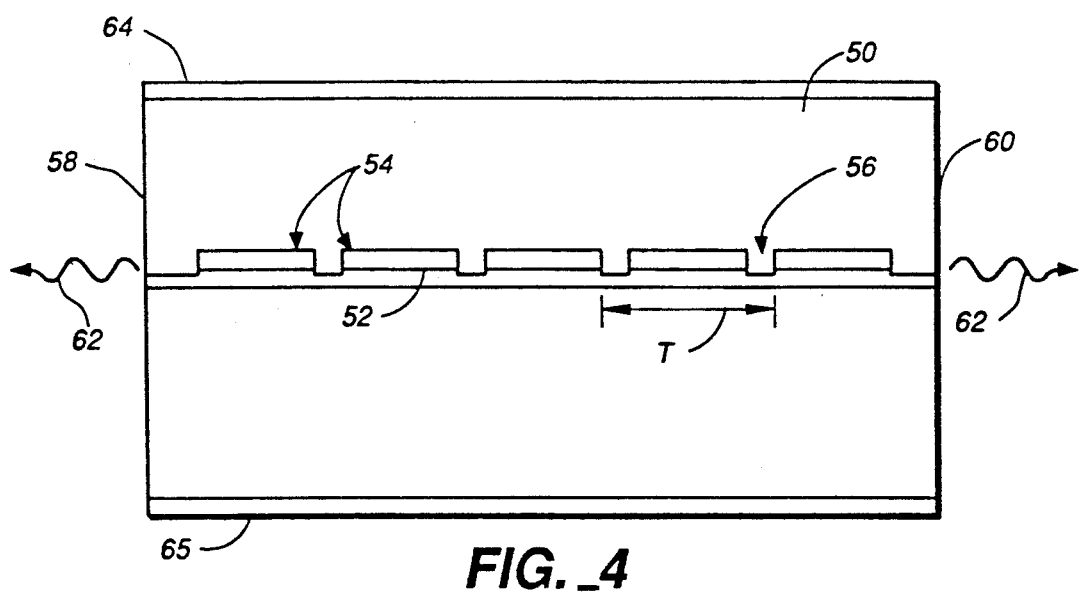
FIG._4

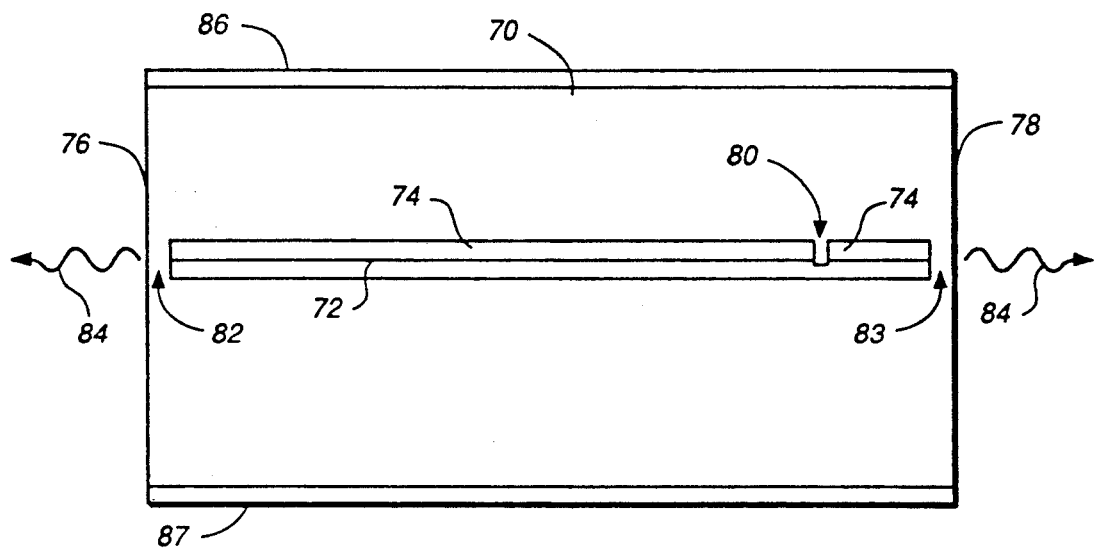
FIG._5
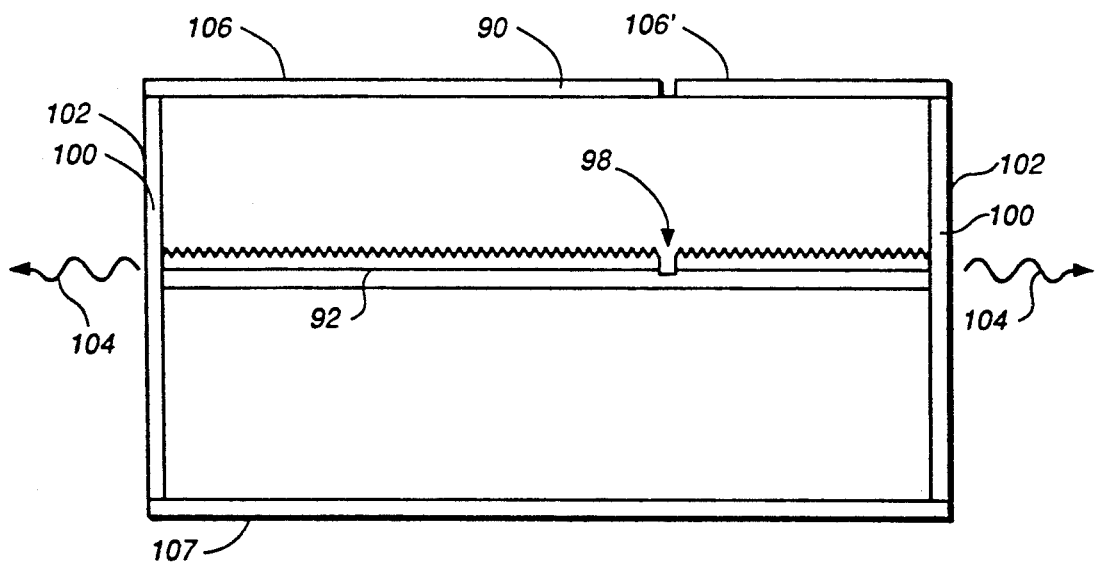
FIG._6

SPECTRALLY STABLE LASER DIODE WITH INTERNAL REFLECTOR

DESCRIPTION

1. Technical Field

The present invention relates to semiconductor diode lasers that have a construction designed to stabilize the output frequency of the emitted beam, and in particular to lasers characterized by their particular resonant cavity or having plural cavities.

2. Background Art

In laser diodes with a standard Fabry-Perot resonant cavity, the possible spectral modes are dictated by the round trip resonances of the cavity. For typical laser geometrics, these resonances occur every 0.2 to 0.3 nanometers. Losses for adjacent spectral modes are very nearly equal. Therefore, though the laser oscillates in a single spectral mode while under steady state conditions, slight temperature or current variations can cause the laser to shift or "hop" to another spectral mode. Such mode hopping can be particularly pronounced when the laser is deliberately amplitude modulated as part of an optical communication system.

Existing designs that attempt to minimize mode hopping use a variety of approaches. Most employ some type of discontinuity in the laser, such as cleavages in the semiconductor body of the laser, or different waveguides or diffraction gratings in portions of the laser cavity. For example, in U.S. Pat. No. 4,802,182, Thornton et al. describe a laser/modulator structure having two active regions coupled by a passive waveguide formed between the two regions. The waveguide core has an energy bandgap higher than both active media, and thus has low optical absorption at the gain wavelengths of either region. The dual cavity affords mode stability by coupling the resonant conditions of each cavity. The active regions are separate and distinct from the passive waveguide structure.

In U.S. Pat. No. 4,829,535, Utaka et al. describe a semiconductor laser with five electrically isolated and independently driven regions to control the output characteristics of the laser. Three of the regions, including an active filter region with a diffraction grating and two gain adjusting regions integrated on both sides of the active filter region, form a gain region. Two waveguide regions are disposed on each end of the gain region. Each region is independently driven to affect the refractive indices and gain of the regions, and thereby to control the oscillation wavelength of the laser. The transmission wavelength of the diffraction grating in the filter region substantially determines the wavelength that will be selected, while the current supplied to the gain adjusting regions largely determines the optical power output of the laser.

In U.S. Pat. No. 4,788,689, Tokuda et al. describe a composite resonator-type semiconductor laser in which two independent laser portions of different cavity lengths are formed precisely and without cleavage by diffusing or implanting an impurity through a mask to mix a portion of the active region's quantum well structure or a superlattice structure of the optical waveguide at a precise location. The two laser portions are electrically isolated to obtain a tuning effect when one of the two laser portions is injected with a current that is less than a threshold value for laser oscillation. The mixed portion between the two laser portions is unpumped.

In U.S. Pat. No. 4,815,084, Scifres et al. describe semiconductor lasers with various integrated optical elements formed, for example, by impurity induced disordering of the active region quantum wells. One element shown in FIG. 15 of that patent is an internal etalon window placed in a non-gain region of the laser. The etalon windows have a higher bandgap than the active region and are located outside the electrically pumped gain regions of the device.

It is an object of the invention to provide a laser geometry which will lead to greater spectral mode stability, so that it will not shift frequency under an amplitude modulation.

DISCLOSURE OF THE INVENTION

The above objects have been met with a laser geometry that incorporates an additional internal reflector within the laser cavity. This addition of another reflecting interface in the cavity requires the oscillating spectral mode to meet a more complex resonance condition dictated by the "multiple cavities". The net effect is that the internal losses of the modes of the cavity have been modified in such a way that the losses of adjacent modes are no longer nearly equal. This will inhibit or reduce the tendency of the laser to hop to a different spectral mode under current or temperature variations.

The laser geometry may include a single internal reflector or have multiple internal reflectors forming an internal etalon. The geometry may combine such a reflector or reflectors with window regions at the laser facets. Grating feedback devices, such as distributed feedback (DFB) or distributed Bragg reflector (DBR) structures may be combined with the internal reflector or reflectors. In another embodiment, the current is independently controllable on the two sides of an internal reflector. This would add independent tunability of one cavity with respect to the other and lead to continuous wavelength tuning of the laser.

The internal reflector structure may be formed in the laser diode by an impurity induced disordering (IID) technique. Internal reflection occurs due to the refractive index change in the higher aluminum content of disordered material. Incorporation of superlattice regions adjacent to the active region enhances the change produced by the disordering. Alternative processes for forming the internal reflector structure include etch and regrowth, ion implantation, laser disordering, diffusion and substrate etching prior to crystal growth.

The internal mirror geometry has been demonstrated to provide a stable single spectral mode under current modulation.

BRIEF DESCRIPTION OF THE DRAWINGS

FIG. 1 is a side view of a laser of the present invention having a single internal reflector.

FIGS. 2a-2c are graphs of negative cavity loss versus frequency for the spectral modes of each of the two cavities formed by the internal reflector in the laser of FIG. 1, as well as of the resulting composite cavity of the laser of FIG. 1, respectively.

FIGS. 3-6 are side views of alternate embodiments of lasers in accord with the present invention, respectively having two internal reflectors forming an active etalon, multiple periodic reflectors, an internal reflector combined with window regions and an internal reflector combined with a feedback grating.

BEST MODE FOR CARRYING OUT THE INVENTION

With reference to FIG. 1, a laser diode 10 of the present invention includes an active region 12 and an optical waveguide 14 proximate to the active region 12 between cleaved mirror facets 16 and 18 of the diode body. The active region 12 may consist of either a single light emitting semiconductor layer or multiple layers in a quantum well structure. Cladding layers on both sides of the active region 12, having a higher electronic bandgap and lower refractive index than the active region 12, define the optical waveguide 14. The waveguide 14 may also be defined by a superlattice structure of multiple thin layers adjacent to the active region. Conductive contacts inject current into the active region to generate light by stimulated emission in the cavities between mirror facets 16 and 18. The light 22 may be emitted through either one or both facets 16 and 18.

In the laser diode 10, the waveguide 14 and active region 12 are partially interrupted at one point by an internal reflector 20. The internal reflector may be formed by selective impurity induced disordering of a local area of the waveguide 14. Diffusion of an impurity, such as zinc or silicon, through a region of the cladding or superstructure that forms part of the waveguide 14 locally alters the refractive index in that region creating a partially reflective interface for light propagating along the waveguide 14. A refractive index change of at least 0.02 compared to adjacent sections of the active region is preferred. The internal reflector may also be formed by etch and regrowth of wider bandgap GaAlAs, thereby creating a change in refractive index along the optical path. Other processes of forming the internal reflector include ion implantation, laser disordering, diffusion and substrate etching prior to crystal growth.

The additional internal reflector 20 defines a first resonant optical cavity A between facet 16 and reflector 20 and a second resonant optical cavity B between reflector 20 and facet 18. FIG. 2A shows the negative cavity loss versus frequency of cavity A. The periodic nature of the resonant condition produces loss minima (peaks in the graph) separated by a frequency difference of $c/2nL$, where c is the speed of light in a vacuum, n is the effective refractive index of light in the waveguide 14 and L is the length of cavity A between facet 16 and reflector 20. FIG. 2B shows the corresponding resonance condition of cavity B. Note that the shorter length of cavity B produces a greater frequency separation between peaks of minimum loss. Preferably, the internal reflector 20 within the semiconductor body is positioned at least 10% closer to one of the end facets 18 than to the other of the end facets 16. The resulting composite resonance condition is approximately the sum of the two conditions for cavities A and B, and is seen in FIG. 2C. The laser 10 has local loss minima, corresponding to cavity A, that define the possible longitudinal modes of the laser 10. Unlike a laser with only a simple Fabry-Perot cavity defined solely by end facets 16 and 18, the laser 10 with internal reflector 20 has adjacent modes, modes 26 and 27 for example, that have differing amounts of loss in the overall composite cavity. Absolute peaks of minimum loss, corresponding to the modes at points 26 and 28 in FIG. 2C, are separated by a greater frequency, thereby minimizing mode hopping. The frequency separation of modes 26 and 28 is approximately $c/2nl$, where l is the length of cavity B.

With reference to FIG. 3, a laser diode 30 has an active region 32 and optical waveguide 34 proximate to the active region 32 between reflective facets 36 and 38. Conductive contacts 48 and 49 inject current into active region 32 to produce a light output 46 through one or both of the facets 36 and 38. The waveguide 34 is interrupted by a pair of internal reflectors 40 and 42 defining an etalon 44 between the reflectors 40 and 42. Typically, the internal reflectors 40 and 42 are spaced apart by about 3 to 20 μm. Except for the pair of reflectors 40 and 42 defining the etalon 44, the laser 30 is constructed in the same way as laser 10 in FIG. 1. The internal reflectors 40 and 42 themselves are also constructed in the same way as internal reflector 20 in FIG. 1, i.e. by local impurity induced disordering of the cladding layer or superlattice structure defining part of the waveguide 34.

Having multiple internal reflectors further constrains the resonance condition of the overall laser. In FIG. 3, there are effectively three cavities defined, respectively, between facet 36 and reflector 40, by etalon 44, and between reflector 42 and facet 38. If the two cavities other than etalon 44 have the same length, then the resonance condition is like that in FIG. 2C, with the size of the etalon 44 determining the spacing of absolute peaks of minimum cavity loss. It has been discovered that the multiple cavity effect on resonance condition works most effectively if etalon 44 is an active laser cavity. A passive etalon window does produce an additional cavity between its reflective boundaries, even if the boundaries are substantially spaced apart. However, the loss incurred in this design is substantial, because there is no gain in the window region of such an etalon. Thus, only discrete reflectors 40 and 42 separated by a gain section 45 produces an active etalon cavity 44 that reduces mode hopping.

With reference to FIG. 4, a laser diode 50 has an active region 52 and optical waveguide segments 54 spaced along the length of the active region 52 between reflective end facets 58 and 60. Conductive contacts 64 and 65 inject current into active region 52 to produce a light output 62 through one or both facets 58 and 60. In this embodiment, internal reflectors 56 interrupt the waveguide 54 periodically, with an equal spacing between reflectors 56 or a period T of about 3 to 20 μm. The periodic reflections produce a cavity condition dominated by the period T rather than the facet-to-facet distance, so the resonant modes are spaced further apart at frequencies $mc/2nT$, where m is an integer.

With reference to FIGS. 5 and 6, laser diodes 70 and 90 are substantially the same as laser diode 10 in FIG. 1, having active regions 72 and 92, waveguide 74 and 94 proximate to the active regions, end facets 76, 78 and 100, and conductive contacts 86, 87, 106 and 107 for current injection. The laser diodes produce light output 84 and 104 through one or both facets. Further, internal reflectors 80 and 98 formed by impurity induced disordering (IID) produce a complex cavity condition that leads to reduced mode hopping under varying conditions. However, the embodiment in FIG. 5 also has window regions 82 and 83 formed adjacent to facets 76 and 78 respectively to reduce damage to the facets at high optical power levels. The embodiment in FIG. 6 has a feedback grating 96 formed in optical communication with the waveguide 94. Typically, grating 96 is etched in a boundary surface of one of the cladding layers that make up waveguide 94. The current could be independently controlled on the two sides of the internal reflector, as shown, by having two electrically isolated conductive contacts 106 and 106' on one side of the laser diode body. This adds independent tunability of one cavity with respect to the other, and leads to continuous wavelength tunability of the laser 90. Other laser configurations in FIGS. 1-5 could also have independent current injection on different sides of one or more internal reflectors.

We claim:

1. A laser diode comprising:
   a plurality of contiguous semiconductor layers on a substrate, the layers and substrate forming a semiconductor body, at least one of said layers forming an active region for lightwave generation, at least one layer proximate to said active region forming a lightguiding region together with said active region,
   bias means for injecting current into said active region to produce said lightwaves, and
   means for obtaining optical feedback of said lightwaves to achieve lasing operation, said feedback means including a pair of end reflectors and at least one light reflector within said semiconductor body located between said pair of end reflectors, wherein said at least one light reflector within said semiconductor body is positioned at least 10% closer to one of said end reflectors than the other of said end reflectors, whereby said feedback means defines multiple resonant cavities in tandem in said semiconductor body between each adjacent pair of reflectors with said active region being present in each said cavity.

2. The laser diode of claim 1 wherein said end reflectors are end facets on said semiconductor body.

3. A laser diode comprising:
   a plurality of contiguous semiconductor layers on a substrate, the layers and substrate forming a semiconductor body, at least one of said layers forming an active region for lightwave generation, at least one layer proximate to said active region forming a lightguiding region together with said active region,
   bias means for injecting current into said active region to produce said lightwaves, and
   means for obtaining optical feedback of said lightwaves to achieve lasing operation, said feedback means including grating reflectors formed in said semiconductor body proximate to said lightguiding region and at least one light reflector within said semiconductor body, whereby said feedback means defines multiple cavities in tandem in said semiconductor body with said active region being present in each said cavity.

4. A laser diode comprising:
   a plurality of contiguous semiconductor layers on a substrate, the layers and substrate forming a semiconductor body, at least one of said layers forming an active region for lightwave generation, at least one layer proximate to said active region forming a lightguiding region together with said active region,
   bias means for injecting current into said active region to produce said lightwaves, and
   means for obtaining optical feedback of said lightwaves to achieve lasing operation, said feedback means including multiple internal light reflectors within said semiconductor body, whereby said feedback means defines multiple resonant cavities in tandem in said semiconductor body with said active region being present in each said cavity.

5. The laser diode of claim 4 wherein there is a pair of internal light reflectors within said semiconductor body with a portion of said active region being present between said pair of internal light reflectors and said portion of said active region having current injected thereinto by said bias means, whereby said pair of internal reflectors forms an active internal etalon in said semiconductor body.

6. The laser diode of claim 4 wherein said multiple internal light reflectors are periodically spaced.

7. A laser diode comprising:
   a plurality of contiguous semiconductor layers on a substrate, the layers and substrate forming a semiconductor body, at least one of said layers forming an active region for lightwave generation, at least one layer proximate to said active region forming a lightguiding region together with said active region,
   transparent window regions formed at ends of said semiconductor body,
   bias means for injecting current into said active region to produce said lightwaves, and
   means for obtaining optical feedback of said lightwaves to achieve lasing operation, said feedback means including at least one light reflector within said semiconductor body, whereby said feedback means defines multiple resonant cavities in tandem in said semiconductor body with said active region being present in each said cavity.

8. A laser diode comprising:
   a plurality of contiguous semiconductor layers, at least one of said layers forming an active region for lightwave generation and propagation under lasing conditions,
   electrical bias means for injecting current into said active region to produce said lightwaves, and
   a pair of end reflectors at opposite ends of said active region, said end reflectors defining a resonant optical cavity for said lightwaves to achieve lasing operation, at least one section of said laser active region positioned between said end reflectors having an equivalent index of refraction larger than an adjacent section of said laser active region, wherein a section of said laser active region is electrically unpumped, at least one other section of said laser active region being electrically pumped by said electrical bias means.

9. The laser diode of claim 8 wherein said equivalent index of refraction of said at least one section of said laser active region is at least 0.02 larger than the equivalent index of refraction of said adjacent section of said laser active region.

10. A laser diode comprising:
    a plurality of contiguous semiconductor layers disposed on a substrate so as to form a semiconductor body, at least one of said layers forming an active region for lightwave generation and propagation under lasing conditions,
    electrical bias means for injecting current into said active region to produce said lightwaves,
    a pair of end reflectors at opposite ends of said active region, said end reflectors defining a resonant optical cavity for said lightwaves to achieve lasing operation, and
    a pair of internal light reflectors spaced apart within said semiconductor body between said end reflectors, said active region including a portion between said internal light reflectors, said portion having current injected therethrough by said bias means, said pair of internal reflectors thereby forming an active internal etalon in said semiconductor body with a different resonant condition from said resonant optical cavity.

11. The laser diode of claim 10 wherein said pair of end reflectors are end facets on said semiconductor body.

12. The laser diode of claim 10 wherein said end reflectors comprise distributed Bragg reflector gratings.

13. The laser diode of claim 10 further comprising transparent window regions formed at ends of said semiconductor body.

14. The laser diode of claim 10 wherein said electrical bias means includes three electrically isolated, longitudinally spaced, biasing regions, a center biasing region disposed relative to said internal etalon to inject a different current into said active region portion between said pair of internal light reflectors from other portions of said active region.

* * * * *